(12) United States Patent
Guliani et al.

(10) Patent No.: US 9,767,896 B2
(45) Date of Patent: Sep. 19, 2017

(54) APPARATUSES AND METHODS FOR ACCESSING MEMORY CELLS IN SEMICONDUCTOR MEMORIES

(71) Applicant: MICRON TECHNOLOGY, INC., Boise, ID (US)

(72) Inventors: Sandeep Guliani, Folsom, CA (US); Balaji Srinivasan, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/003,498

(22) Filed: Jan. 21, 2016

(65) Prior Publication Data
US 2017/0213589 A1 Jul. 27, 2017

(51) Int. Cl.
| G11C 11/00 | (2006.01) |
| G11C 13/00 | (2006.01) |
| G11C 8/10 | (2006.01) |
| G11C 7/14 | (2006.01) |
| G11C 7/06 | (2006.01) |

(52) U.S. Cl.
CPC .......... *G11C 13/0004* (2013.01); *G11C 7/062* (2013.01); *G11C 7/14* (2013.01); *G11C 8/10* (2013.01)

(58) Field of Classification Search
CPC ....... G11C 13/0004; G11C 8/10; G11C 7/062; G11C 7/14
USPC .......... 365/145, 148, 163, 204, 226, 230.06
See application file for complete search history.

(56) References Cited

U.S. PATENT DOCUMENTS

| 6,456,524 B1* | 9/2002 | Perner ............... G11C 11/16 365/148 |
| 2015/0364193 A1* | 12/2015 | Shimakawa ....... G11C 13/0069 365/160 |

* cited by examiner

*Primary Examiner* — Tha-O H Bui
(74) *Attorney, Agent, or Firm* — Dorsey & Whitney LLP (57) ABSTRACT

Apparatuses and methods for accessing a memory cell are described. An example apparatus includes a first voltage circuit coupled to a node and is configured to provide a first voltage to the node and includes a second voltage circuit coupled to a node and is configured to provide a second voltage to the node. A memory cell is coupled to first and second access lines. A decoder circuit is coupled to the node and the first access line, and is configured to selectively couple the first access line to the node. The first voltage circuit is configured to provide the first voltage to the node before the second voltage circuit provides the second voltage to the node, and the second voltage circuit stops providing the second voltage before the node reaches the second voltage.

22 Claims, 5 Drawing Sheets

APPARATUSES AND METHODS FOR ACCESSING MEMORY CELLS IN SEMICONDUCTOR MEMORIES

BACKGROUND

Semiconductor memories may include threshold-type memory cells, which are memory cells that are accessed by providing a voltage across a memory cell, and the data value stored is based on a threshold voltage of the memory cell. For example, the data value may be based on whether the threshold voltage of the memory cell is exceeded when a voltage is applied across the memory cell, and whether the memory cell conducts current in response to the voltage provided across the memory cell. The data value stored may be changed, for example, by applying a voltage sufficient to change the threshold voltage of the memory cell. An example of a threshold-type memory cell may be a phase change memory cell.

The voltage applied across a memory cell is typically provided by two access lines to which the memory cell is coupled. Also coupled to each of the access lines are other memory cells. Each of the memory cells may have a respective threshold voltage, with some having a relatively low threshold voltage and others having a relatively high threshold voltage. When a voltage is applied to a target memory cell by the two access lines, the other memory cells coupled to the respective access lines are also subjected to respective voltage. While the respective voltage to which the other memory cells is subject is not sufficient to access the other memory cells also coupled to the respective lines, the voltage may nonetheless be sufficiently high to inadvertently degrade or change the threshold voltage of some of the other cells. For example, where one of the other memory cells has a relatively low threshold voltage, and the target memory cell has a relatively high threshold voltage, the voltage to which the other memory cell is subjected when accessing the target memory cell may be sufficient to degrade the relatively low threshold voltage (e.g., increase the relatively low threshold voltage), or change the relatively low threshold voltage to a relatively high threshold voltage, thereby changing the data value stored by the other memory cell. If such an event were to occur, the memory has failed.

Thus, there is a desire to have apparatuses and methods for accessing memory cells that mitigate application of access voltages that may degrade performance of the memory.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
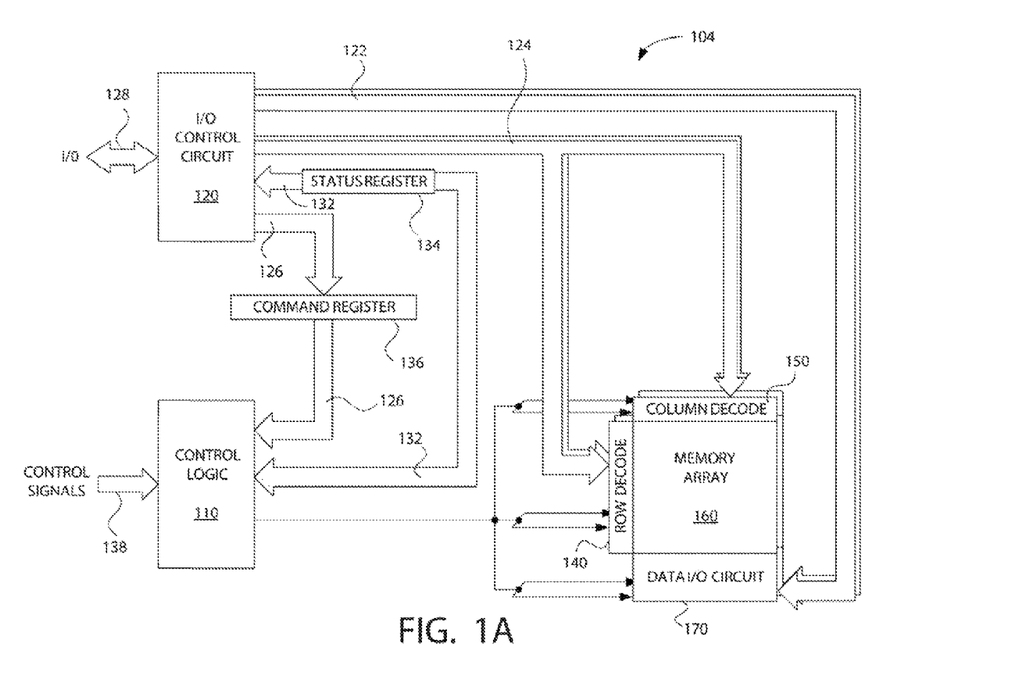
FIG. 1A is a block diagram of a memory according to an embodiment of the invention.

FIG. 1A illustrates an apparatus that includes a memory device 104 according to an embodiment of the present invention. The memory device 104 includes a memory array 160 with a plurality of memory cells that are configured to store data. The memory cells may be accessed in the array through the use of various access lines, for example, word lines (WLs) and/or bit lines (BLs). The memory cells may be non-volatile memory cells, such as NAND or NOR flash cells, phase change memory cells, memory cells that include chalcogenide material, or may generally be any type of memory cells. The memory cells of the memory array 160 can be arranged in a memory array architecture. For example, in one embodiment, the memory cells are arranged in a 3D cross-point architecture. In other embodiments, other memory array architectures may be used, for example, a single-level cross-point architecture, a 3D array architecture including a plurality of decks, with each of the decks including access lines and memory cells, among others. The memory cells may be single level cells configured to store data for one bit of data. The memory cells may also be multi-level cells configured to store data for more than one bit of data. It will be appreciated that those of ordinary skill in the art will have sufficient understanding from the description provided herein to modify circuits of a memory device (e.g., decoder circuits, input/output circuits, control logic, etc.) to practice the disclosed invention, including practicing embodiments of the disclosed invention in memory array architectures other than those expressly described herein.

A data strobe signal DQS may be transmitted through a data strobe bus (not shown). The DQS signal may be used to provide timing information for the transfer of data to the memory device 104 or from the memory device 104. The I/O bus 128 is connected to an I/O control circuit 120 that routes data signals, address information signals, and other signals between the I/O bus 128 and an internal data bus 122, an internal address bus 124, and/or an internal command bus 126. The internal address bus 124 may be provided address information by the I/O control circuit 120. The internal address bus 124 may provide block-row address signals to a row decoder 140 and column address signals to a column decoder 150. The row decoder 140 and column decoder 150 may be used to select blocks of memory cells for memory operations, for example, read and write operations. The row decoder 140 and/or the column decoder 150 may include one or more signal line drivers configured to provide a biasing signal to one or more of the signal lines in the memory array 160. The I/O control circuit 120 is coupled to a status register 134 through a status register bus 132. Status bits stored by the status register 134 may be provided by the I/O control circuit 120 responsive to a read status command provided to the memory device 104. The status bits may have respective values to indicate a status condition of various aspects of the memory and its operation.

The memory device 104 also includes a control logic 110 that receives a number of control signals 138 either externally or through the command bus 126 to control the operation of the memory device 104. The control signals 138 may be implemented with any appropriate interface protocol. For example, the control signals 138 may be pin based, as is common in dynamic random access memory and flash memory (e.g., NAND flash), or op-code based. Example control signals 138 include clock signals, read/write signals, clock enable signals, etc. A command register 136 is coupled to the internal command bus 126 to store information received by the I/O control circuit 120 and provide the information to the control logic 110. The control logic 110 may further access a status register 134 through the status register bus 132, for example, to update the status bits as status conditions change. The control logic 110 may be configured to provide internal control signals to various circuits of the memory device 104. For example, responsive to receiving a memory access command (e.g., read, write), the control logic 110 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

A data I/O circuit 170 includes one or more circuits configured to facilitate data transfer between the I/O control circuit 120 and the memory array 160 based on signals received from the control logic 110. In various embodiments, the data I/O circuit 170 may include one or more registers, buffers, and other circuits for managing data transfer between the memory array 160 and the I/O control circuit 120. For example, during a write operation, the I/O control circuit 120 receives the data to be written through the I/O bus 128 and provides the data to the data I/O circuit 170 via the internal data bus 122. The data I/O circuit 170 writes the data to the memory array 160 based on control signals provided by the control logic 110 at a location specified by the row decoder 140 and the column decoder 150. During a read operation, the data I/O circuit reads data from the memory array 160 based on control signals provided by the control logic 110 at an address specified by the row decoder 140 and the column decoder 150. The data I/O circuit provides the read data to the I/O control circuit via the internal data bus 122. The I/O control circuit 120 then provides the read data on the I/O bus 128.

Figure 1B:
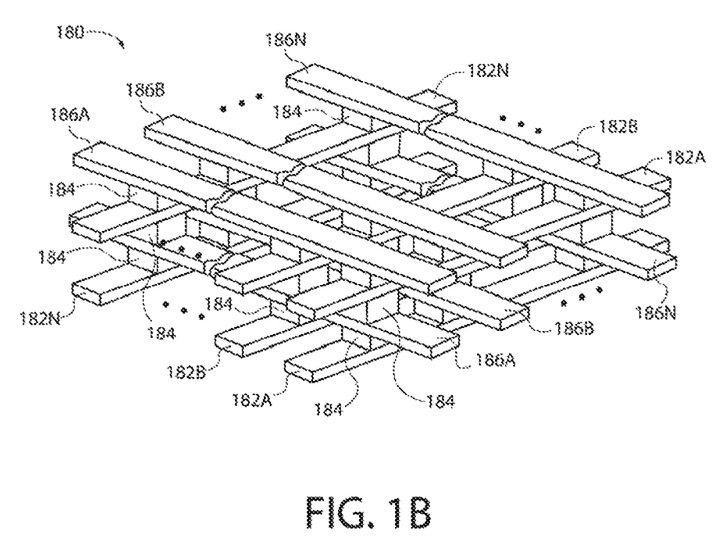
FIG. 1B is a diagram of a portion of a three-dimensional (3D) cross-point memory array according to an embodiment of the invention.

FIG. 1B is a diagram of a portion of a 3D cross-point memory array, generally designated 180, in accordance with an embodiment of the present invention. In various embodiments, the memory array 180 can be implemented as the memory array 160 of FIG. 1A. The memory array 180 includes a first number of access lines 182A, 182B, ..., 182N (collectively referred to as access lines 182) and a first number of access lines 186A, 186B, ..., 186N (collectively referred to as access lines 186). As shown in FIG. 1B, the access lines 182 may be arranged parallel to one another. The access lines 186 can be arranged parallel to one another and orthogonal to the access lines 182. The access lines 182 and the access lines 186 can be made from a conductive material, such as copper, tungsten, titanium, aluminum, etc. Layers or decks of access lines can be stacked to create a 3D lattice structure. As shown in FIG. 1B, layers of access lines 182 alternate with layers of access lines 186 to form a 3D structure.

The memory array 180 includes a plurality of memory cells 184. In one embodiment, the memory cells 184 can be phase change memory cells. In some embodiments, the memory cells 184 may include a chalcogenide material. Each memory cell 184 is connected to first and second access lines (e.g., access line 182A and access line 186A). The layers or decks of access lines may be separately addressed so that memory cells associated with the access lines of a deck may be separately accessible from the memory cells associated with access lines of a different deck. By connecting each memory cell to first and second access lines in a 3D cross-point array, each memory cell 184 is individually accessible by specifying the access lines to which the memory cell 184 is coupled, for example, by a memory address. In a number of embodiments, memory array 180 can include more or access bit lines 182 and 186, and/or memory cells than shown in the example of FIG. 1B.

Figure 2:
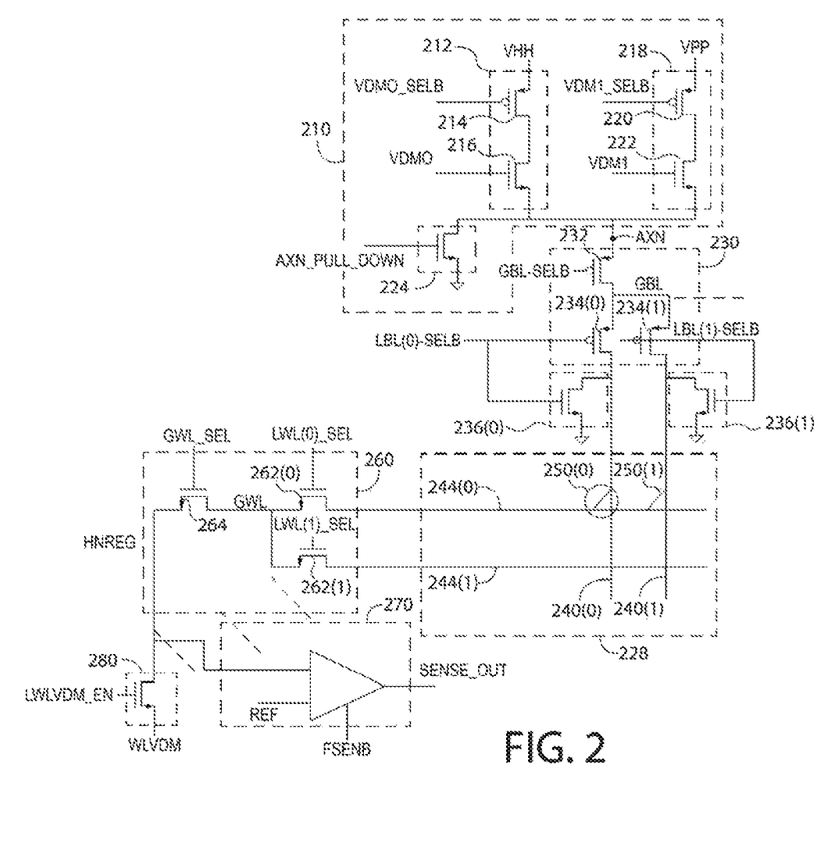
FIG. 2 is a schematic diagram of a portion of the memory according to an embodiment of the invention.

FIG. 2 illustrates a portion of a memory according to an embodiment of the invention. FIG. 2 illustrates a voltage source 210 that provides voltages to a decoder circuit 230. The decoder circuit 230 is coupled to access lines and memory cells of a memory array 228. For example, the decoder circuit 230 is coupled to access lines 240(0) and 240(1) through a global access line GBL, and is configured to select access lines to access memory cells of the memory array 228. Memory cells 250(0) and 250(1) are coupled to the access lines 240(0) and 240(1), respectively. The global access line GBL may be a global bit line and the access lines 240(0) and 240(1) may be local bit lines. Access lines 244(0) and 244(1) are also coupled to the memory cells 250(0) and 250(1). The memory cells 250(0) and 250(1) are coupled at the intersections between the access line 244(0) and the access lines 240(0) and 240(1), respectively. Decoder circuit 260 is coupled to the access lines 244(0) and 244(1) through a global access line GWL. The global access line GWL may be a global word line and the access lines 244(0) and 244(1) may be local word lines.

Selection of the access lines 240 and 244 by the decoder circuits 230 and 260 may be based on a memory address associated with a memory access command. A sense amplifier 270 may be selectively coupled to the access lines 244(0) or 244(1) to compare a voltage of the access line to a reference voltage REF to determine a logic value of the data stored by a memory cell. The sense amplifier 270 is activated responsive to a control signal FSENB. During a memory access operation, a voltage source 280 is configured to provide an access line voltage WLVDM to a selected access line (e.g., access line 244(0), 244(1), etc.) responsive to a control signal WLVDM_EN. In some embodiments, the WLVDM voltage is a negative voltage, and the WLVDM voltage provides an increased voltage across a target memory cell being accessed. Memory cells (e.g., memory cells 250(0) and 250(1)) may be written (e.g., set) to store data of a first logic value. A memory cell may remain unwritten or may be erased (e.g., reset) to change the data stored by the memory cell to a second logic value. The data of a memory cell that is accessed is sensed by providing an access voltage across a target cell through the respective access lines. Typically, set memory cells have a lower threshold voltage than reset memory cells, and thus, a set memory cell is configured to conduct a current from one access line to the other access line when the access voltage across the set cell exceeds the lower threshold voltage. In contrast, a reset memory cell is configured to not conduct a current for the same voltage due to the higher threshold voltage.

The voltage source 210 includes a voltage circuit 212 having a source follower circuit. The voltage circuit 212 includes transistors 214 and 216. The voltage circuit 212 provides a voltage to a node AXN responsive to control signals VDM0_SELB and VDM0. The voltage circuit 212 is configured to receive a supply voltage VHH, and the voltage provided by the voltage circuit 212 may be based on the VHH voltage. When activated by the VDM0_SELB signal, the transistor 214 provides the VHH voltage to the drain of the transistor 216. The transistor 216 is configured to provide a voltage to the AXN node based on the VDM0 signal and the VHH voltage. For example, assuming the VDM0 signal is equal to VHH, the resulting voltage provided through the transistor 216 to the AXN node is VHH-Vt (216), where Vt (216) is the threshold voltage Vt of the transistor 216. The voltage of the VDM0 signal may be adjusted to vary the voltage provided by the voltage circuit 212 to the AXN node.

The voltage source 210 further includes a voltage circuit 218 including a source follower circuit having transistors 220 and 222. The voltage circuit 218 provides a voltage to the AXN node responsive to control signals VDM1_SELB and VDM1. The voltage circuit 218 is configured to receive a supply voltage VPP. When activated by the VDM1_SELB signal, the transistor 220 provides the VPP voltage to the drain of the transistor 222. The transistor 222 is configured to provide a voltage to the AXN node based on the VDM1 signal and the VPP voltage. For example, assuming the VDM1 signal is equal to VPP, the resulting voltage provided through the transistor 222 to the AXN node is VPP-Vt (222), where Vt (222) is a threshold voltage Vt of the transistor 222. In some embodiments, the supply voltage VPP is greater than the supply voltage VHH, however, in other embodiments the supply voltages VPP and VHH are equal, or the supply voltage VHH is greater than the supply voltage VPP. In some embodiments, the supply voltage VPP may be pumped voltage, that is, a voltage that is greater than an externally provided supply voltage. A charge pump may be used to provide a pumped voltage. The supply voltage VPP and/or the voltage VPP-Vt may be greater than the Vt of a reset memory cell in some embodiments. In some embodiments, the supply voltage VPP and/or the voltage VPP-Vt may be less than the Vt of a reset memory cell. The supply voltage VPP and/or the voltage VPP-Vt may be approximately equal to the Vt of a reset memory cell in other embodiments.

A discharge circuit 224 is also included in the voltage source 210. The discharge circuit 224 includes a transistor that is coupled to the AXN node. The discharge circuit 224 couples the AXN node to a reference voltage (e.g., ground) responsive to a control signal AXN_PULL_DOWN. When activated, the discharge circuit 224 provides a conductive path from the AXN node to the reference voltage to discharge a voltage on the AXN node.

In the embodiment of FIG. 2, the transistors 214 and 220 are shown as p-channel field effect transistors (pFETs) and the transistors 216 and 222, and the discharge circuit 224 are shown as n-channel field effect transistors (nFETs). In other embodiments, however, different types of transistors may be used in the voltage source 210 without departing from the scope of the present invention.

The decoder circuit 230 includes a transistor 232 to couple the AXN node to the global access line GBL responsive to a control signal GBL_SELB. The decoder circuit further includes transistors 234(0) and 234(1) configured to selectively couple the GBL to respective access lines 240(0) and 240(1) responsive to respective control signals LBL(0)_SELB and LBL(1)_SELB. A local signal line discharge circuit 236(0) is configured to couple the access line 240(0) to a reference voltage (e.g., ground) responsive to the LBL(0)_SELB signal. For example, responsive to an inactive LBL(0)_SELB signal (e.g., LBL(0)_SELB having a high logic value), the local signal line discharge circuit 236(0) is activated to couple the access line 240(0) to the reference voltage. A local signal line discharge circuit 236(1) is configured to couple the access line 240(1) to the reference voltage responsive to the LBL(1)_SELB signal. The local signal line discharge circuits 236(0) and 236(1) may be activated to discharge the respective access lines after the decoder circuit 230 decouples the respective access line from the AXN node. The transistors 232, 234(0), and 234(1) are illustrated in FIG. 2 as pFETs, and the local signal line discharge circuits 236(0) and 236(1) are shown as nFETs. However, different types of transistors may be used in other embodiments without departing from the scope of the present invention.

The decoder circuit 260 includes a transistor 262(0) configured to couple the access line 244(0) to the global access line GWL responsive to a control signal LWL(0)_SEL, and further includes a transistor 262(1) configured to couple the access line 244(1) to the GWL responsive to a control signal LWL(1)_SEL. A transistor 264 is configured to couple the GWL to receive a WLVDM voltage (when the voltage source 280 is enabled) and to an input of the sense amplifier 270 when the transistor 264 is activated responsive to a control signal GWL_SEL. When activated by the FSENB signal, the sense amplifier 270 provides an output signal SENSE_OUT having a logic value based on the voltage of the GWL relative to the reference voltage REF provided to the sense amplifier 270.

It will be appreciated that FIG. 2 illustrates a portion of a memory, and that a memory may include additional circuits, access lines, memory cells, etc. illustrated by and described with reference to FIG. 2. Additionally, some or all of the various signals previously described may be provided by control logic and/or an I/O control circuit (e.g., control logic 110 and/or I/O control circuit 120 of FIG. 1A).

In some embodiments, the memory cells 250 are phase change memory cells. In some embodiments, the memory cells 250 include chalcogenide material. In some embodiments, the memory cells 250 and the access lines are arranged as a cross point array.

As previously discussed, memory cells (e.g., memory cells 250(0) and 250(1)) may be set to store data of a first logic value. A memory cell may be reset to store data of a second logic value. The data of a memory cell that is accessed is sensed by providing an access voltage across a target cell through the respective access lines. Typically, set memory cells have a lower threshold voltage than reset memory cells, and thus, a set memory cell is configured to conduct a current from one access line to the other access line when the access voltage across the set cell exceeds the lower threshold voltage. In contrast, a reset memory cell is configured to not conduct a current for the same voltage due to the higher threshold voltage. The current (or lack thereof) results in a voltage that is compared by the sense amplifier 270 against a reference voltage REF to determine the logic value stored by the target memory cell. For example, a set memory cell may result in a voltage on the GWL that is lower than the REF voltage, whereas a reset memory cell may result in a voltage on the GWL that is higher than the REF voltage.

Figure 3:
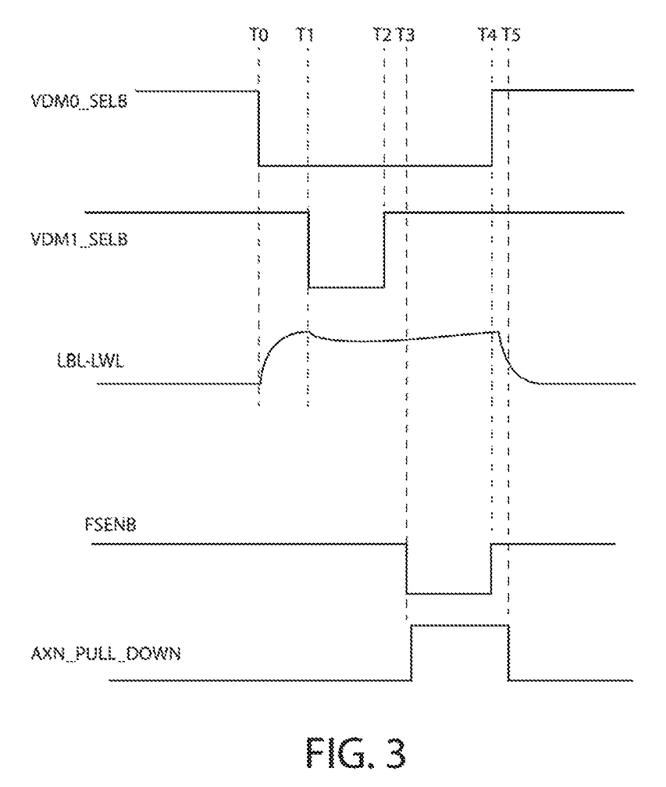
FIG. 3 is a timing diagram of various signals during a read operation according to an embodiment of the invention.

A read operation of the memory cell 250(0) according to an embodiment of the invention will now be described with reference to FIG. 3. The memory cell 250(0) in the example read operation of FIG. 3 is assumed to be set. A read command and memory address is received by the memory. The memory address for the memory cell 250(0) is decoded and the corresponding access lines 240(0) and 244(0) are identified. Active GWL_SEL and LWL(0)_SEL signals (e.g., active high logic value) activate the transistors 264 and 262(0) of the decoder circuit 260, and active GBL_SELB and LBL(0)_SELB signals (e.g., active low logic value) activate the transistors 232 and 234 of decoder circuit 230.

At time T0, the VDM0_SELB signal changes from a high logic value to a low logic value to activate the transistor 214 to provide the VHH voltage to the AXN node through the transistor 216. It is assumed for the example of FIG. 3 that the voltage of the VDM0 signal exceeds the Vt of the transistor 216 and is equal to VHH so that a voltage of VHH-Vt (216) is provided to the AXN node by the voltage circuit 212. It will be appreciated that the VDM0 signal may be other voltages as well and is not limited to the specific voltage of the present example. Also at time T0, the voltage source 280 is activated to provide the WLVDM voltage to the memory cell 250(0) through the access line 244(0). As a result, the voltage across the memory cell 250(0), shown in FIG. 3 as LBL-LWL, increases.

At time T1, the VDM1_SELB signal changes from a high logic value to a low logic value to activate the transistor 220 to provide the VPP voltage to the AXN node through the transistor 222. It is assumed for the example of FIG. 3 that the voltage of the VDM1 signal exceeds the Vt of the transistor 222 and is equal to VPP so that a voltage of VPP-Vt (222) is provided to the AXN node by the voltage circuit 218. The voltage of the VDM1 signal may be adjusted to vary the voltage provided to the AXN node. Thus, following time T1, both the voltage circuits 212 and 218 are activated to provide a respective voltage to the AXN node.

As previously discussed, it is assumed for the example of FIG. 3 that the memory cell 250(0) is set, thus, as the voltage across the memory cell 250(0) continues to increase, a threshold voltage of the set memory cell 250(0) is exceeded, and the memory cell 250(0) begins to conduct current. As a result, the current conducted through the memory cell 250(0) from the access line 240(0) to the access line 244(0) causes the voltage of the access line 244(0) to increase from the WLVDM voltage.

At time T2, the VDM1_SELB signal changes from a low logic value to a high logic value to deactivate the transistor 220 thereby deactivating the voltage circuit 218 from providing a voltage to the AXN node. The VDM0_SELB signal remains at the low logic value, however, so that the voltage circuit 212 continues to provide a voltage to the AXN node. At time T3, the FSENB signal changes from a high logic value to a low logic value to activate the sense amplifier 270 to compare the voltage of the access line 244(0) to the REF voltage. With the increased voltage of the access line 244 caused by the current conducting through the memory cell 250(0), the sense amplifier 270 provides a SENSE_OUT signal indicating that the memory cell 250(0) is set (e.g., the voltage of the access line 244 is greater than the REF voltage). Also at time T3, the AXN_PULL_DOWN signal changes from a low logic level to a high logic level to activate the discharge circuit 224. The activated discharge circuit 224 provides a discharge path from the AXN node to the reference voltage to discharge voltage that exceeds the voltage provided by the voltage circuit 212, which continues to be activated. Thus, at least for a portion of when the voltage circuit 212 provides a voltage to the AXN node the activated discharge circuit 224 discharges the AXN node.

At time T4, the FSENB signal changes from the low logic value to the high logic value to deactivate the sense amplifier 270. Also at time T4, the VDM0_SELB signal changes from the low logic value to a high logic value to deactivate the transistor 214 thereby deactivating the voltage circuit 212 from providing a voltage to the AXN node. The AXN node may be discharged through the discharge circuit 224 to the reference voltage. At time T5, the AXN_PULL_DOWN signal changes from the high logic level to the low logic level to deactivate the discharge circuit 224.

Figure 4:
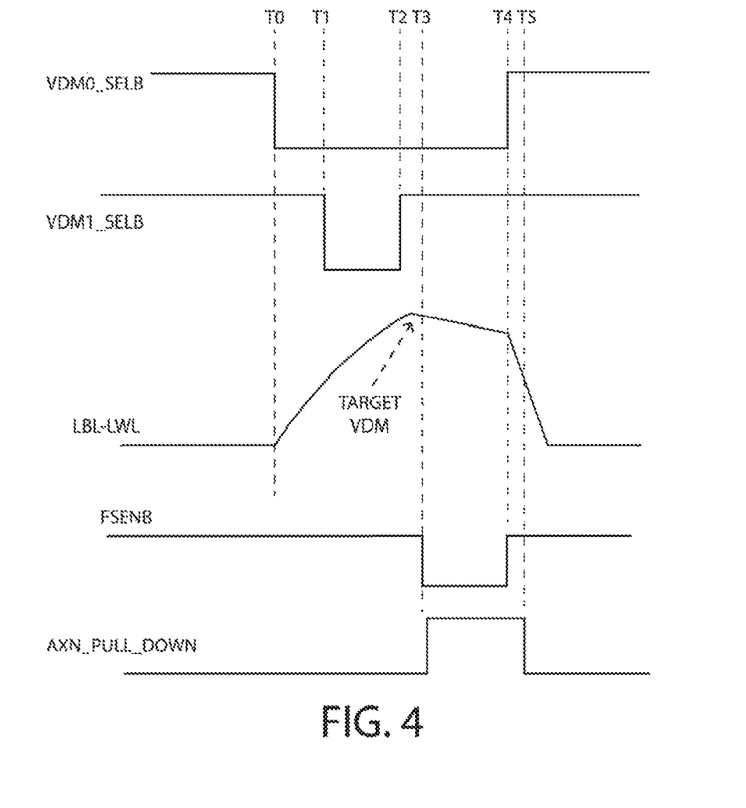
FIG. 4 is a timing diagram of various signals during a read operation according to an embodiment of the invention.

A read operation of the memory cell 250(0) according to an embodiment of the invention will now be described with reference to FIG. 4. The memory cell 250(0) accessed in the read operation of FIG. 4 is assumed to be reset. A read command and memory address is received by the memory. The memory address is decoded and the corresponding access lines 240(0) and 244(0) are identified. The GWL_SEL signal and the LWL(0)_SEL signals activate the transistors 264 and 262(0) of the decoder circuit 260, and the GBL_SELB and LBL(0)_SELB signals activate the transistors 232 and 234 of decoder circuit 230.

At time T0, the VDM0_SELB signal changes from a high logic value to a low logic value to activate the transistor 214 to provide the VHH voltage to the AXN node through the transistor 216. It is assumed for the example of FIG. 4 that the voltage of the VDM0 signal exceeds the Vt of the transistor 216 so that a voltage of VHH-Vt (216) is provided to the AXN node by the voltage circuit 212. Also at time T0, the voltage source 280 is activated to provide the WLVDM voltage to the memory cell 250(0) through the access line 244(0). As a result, the voltage across the memory cell 250(0), shown in FIG. 4 as LBL-LWL, increases.

At time T1, the VDM1_SELB signal changes from a high logic value to a low logic value to activate the transistor 220 to provide the VPP voltage to the AXN node through the transistor 222. It is assumed for the example of FIG. 4 that the voltage of the VDM1 signal exceeds the Vt of the transistor 222 so that a voltage of VPP-Vt (222) is provided to the AXN node by the voltage circuit 218. Thus, following time T1, both the voltage circuits 212 and 218 are activated to provide a respective voltage to the AXN node.

As previously discussed, it is assumed for the example of FIG. 4 that the memory cell 250(0) is reset, thus, in contrast to the set cell of FIG. 3, the threshold voltage of the reset memory cell 250(0) is not exceeded and the voltage across the memory cell 250(0) continues to increase. At time T2, the VDM1_SELB signal changes from a low logic value to a high logic value to deactivate the transistor 220 thereby deactivating the voltage circuit 218 from providing a voltage to the AXN node. The VDM0_SELB signal remains at the low logic value, however, so that the voltage circuit 212 continues to provide a voltage to the AXN node. Deactivating the voltage circuit 218 prevents the voltage across a memory cell from continuing to increase when the memory cell is reset. In some embodiments, the voltage circuit 218 is deactivated to stop providing a voltage to the AXN node before the voltage circuit 212 is deactivated to stop providing a voltage to the AXN node. In some embodiments, the voltage circuit 218 is deactivated to stop providing a voltage before the AXN node reaches the voltage of the voltage circuit 218. That is, the voltage of the AXN node increases over time, and the voltage circuit 218 is deactivated before sufficient time for the AXN node to reach the voltage provided by the voltage circuit 218. The higher voltage provided by the voltage circuit 218 may degrade the reset state of a memory cell is the voltage across the memory cell is allowed to continue to increase, and if repeated over time may cause the memory cell to have an indeterminate state. Thus, deactivating the voltage circuit 218 may help maintain the integrity of the reset state of the memory cell. The timing of activation and deactivation of the voltage circuits 212 and 218 may be set based on design and/or performance parameters for a memory device. For example, the timing may be set during testing of the memory device, such as through the use of fuse or antifuse circuits.

At time T3, the FSENB signal changes from a high logic value to a low logic value to activate the sense amplifier 270 to compare the voltage of the access line 244 to the REF voltage. The voltage of the access line 244 remains approximately at the WLVDM voltage because the reset memory cell 250(0) conducts little to no current. As a result the sense amplifier 270 provides a SENSE_OUT signal indicating that the memory cell 250(0) is reset (e.g., the voltage of the access line 244 is less than the REF voltage). Also at time T3, the AXN_PULL_DOWN signal changes from a low logic level to a high logic level to activate the discharge circuit 224. The activated discharge circuit 224 provides a discharge path from the AXN node to the reference voltage to discharge voltage in excess to that provided by the voltage circuit 212, which continues to be activated.

At time T4, the FSENB signal changes from the low logic value to the high logic value to deactivate the sense amplifier 270. Also at time T4, the VDM0_SELB signal changes from the low logic value to a high logic value to deactivate the transistor 214 thereby deactivating the voltage circuit 212 from providing a voltage to the AXN node. The AXN node may be discharged through the discharge circuit 224 to the reference voltage. At time T5, the AXN_PULL_DOWN signal changes from the high logic level to the low logic level to deactivate the discharge circuit 224.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a first voltage circuit coupled to a node and configured to provide a first voltage to the node;
a second voltage circuit coupled to the node and configured to provide a second voltage to the node, wherein the second voltage is greater than the first voltage;
a memory cell;
a first access line coupled to the memory cell;
a second access line coupled to the memory cell;
a decoder circuit coupled to the node and the first access line, the decoder circuit configured to selectively couple the first access line to the node;
a local signal line discharge circuit coupled to the first access line and configured to couple the first access line to a reference voltage responsive to the decoder circuit decoupling the first access line from the node; and
wherein the first voltage circuit is configured to be provide the first voltage to the node before the second voltage circuit provides the second voltage to the node, and wherein the second voltage circuit stops providing the second voltage before the node reaches the second voltage.

2. The apparatus of claim 1, further comprising a discharge circuit coupled to the node wherein the discharge circuit is configured to discharge the node after the second voltage circuit stops providing the second voltage to the node and at least for a portion of when the first voltage circuit provides the first voltage to the node.

3. The apparatus of claim 1, further comprising:
a third voltage circuit configured to provide a third voltage responsive to being activated; and a second decoder circuit coupled to the third voltage circuit and configured to selectively couple the second access line to the third voltage circuit.

4. The apparatus of claim 1 wherein at least one of the first voltage circuit and the second voltage circuit comprises a source follower circuit.

5. The apparatus of claim 1 wherein at least one of the first voltage circuit and second circuit comprises:
a first transistor configured to be coupled to a supply voltage; and
a second transistor coupled to the first transistor and the node.

6. The apparatus of claim 1 wherein the first access line is a local bit line and the second access line is a local word line.

7. The apparatus of claim 1 wherein the memory cell comprises a phase change memory cell.

8. An apparatus, comprising:
a first voltage circuit coupled to a node and configured to provide a first voltage to the node wherein the first voltage is a positive voltage;
a second voltage circuit coupled to the node and configured to provide a second voltage to the node, wherein the second voltage is a positive greater than the first voltage;
a third voltage circuit configured to provide a third voltage responsive to being activated, wherein the third voltage is a negative voltage;
a memory cell;
a first access line coupled to the memory cell;
a second access line coupled to the memory cell;
a first decoder circuit coupled to the node and the first access line, the first decoder circuit configured to selectively couple the first access line to the node;
a second decoder circuit coupled to the third voltage circuit and configured to selectively couple the second access line to the third voltage circuit; and
wherein the first voltage circuit is configured to be provide the first voltage to the node before the second voltage circuit provides the second voltage to the node, and wherein the second voltage circuit stops providing the second voltage before the node reaches the second voltage.

9. An apparatus, comprising:
a first voltage circuit coupled to a node and configured to provide a first voltage to the node;
a second voltage circuit coupled to the node and configured to provide a second voltage to the node, wherein the second voltage is greater than the first voltage;
a third voltage circuit configured to provide a third voltage responsive to being activated;
a memory cell;
a first access line coupled to the memory cell;
a second access line coupled to the memory cell;
a first decoder circuit coupled to the node and the first access line, the first decoder circuit configured to selectively couple the first access line to the node;
a second decoder circuit coupled to the third voltage circuit and configured to selectively couple the second access line to the third voltage circuit; and
a sense amplifier coupled to the second decoder circuit and configured to compare a voltage of the second access line to a reference voltage REF to determine a logic value of data stored by the memory cell.

10. The apparatus of claim 9 wherein the sense amplifier is further configured to compare the voltage of the access line to the reference voltage while the first voltage circuit provides the first voltage to the node and the second voltage circuit has stopped providing the second voltage to the node.

11. A method, comprising:
   providing a first voltage to a target cell;
   providing a second voltage to the target cell,
   wherein the second voltage is greater than the first voltage and the second voltage is provided while the first voltage is provided, and provision of the first voltage begins before provision of the second voltage and ends after provision of the second voltage ends, and
   wherein when the voltage of the target cell increases during the entire time the second voltage is provided to the target cell, provision of the second voltage ends before provision of the first voltage ends.

12. The method of claim 11, further comprising determining a logic value of the data stored by the target cell.

13. The method of claim 12 wherein the first voltage is provided to the target cell during determining the logic value of the data stored by the target cell.

14. The method of claim 12 wherein the second voltage is not provided to the target cell during determining the logic value of the data stored by the target cell.

15. The method of claim 11, further comprising discharging the second voltage after provision of the second voltage ends.

16. The method of claim 11 wherein applying the first voltage to the target cell comprises applying the first voltage to the cell through an access line and wherein applying the second voltage to the target cell comprises applying the second voltage to the cell through the access line.

17. The method of claim 11, further comprising applying a third voltage to the target cell through a second access line, wherein the third voltage increases the voltage across the target cell.

18. A method, comprising:
   providing a first access voltage across a memory cell, the first access voltage equal to a difference between a first voltage and a second voltage; and
   providing a second access voltage across the memory cell while the first access voltage is provided, the second access voltage equal to a difference between a third voltage and the second voltage,
   wherein the third voltage is greater than the first voltage, and
   wherein providing the second access voltage across the memory cell stops before a voltage across the memory cell reaches the second access voltage when the memory cell is reset.

19. The method of claim 18, further comprising comparing a voltage based on a current conducted by the memory cell to a reference voltage to determine a logic value stored by the memory cell.

20. The method of claim 19 wherein providing the first access voltage across the memory cell comprises providing the first voltage to the memory cell and providing the second voltage to the memory cell, wherein the first voltage is provided while the voltage based on the current conducted by the memory cell is compared to the reference voltage.

21. The method of claim 19 wherein providing the second access voltage across the memory cell stops before the voltage based on a current conducted by the memory cell is compared to the reference voltage.

22. The method of claim 18, further comprising discharging the voltage across the memory cell after providing the second access voltage across the memory cell is stopped and while providing the first access voltage across the memory cell.

* * * * *